(12) United States Patent
Adem et al.

(10) Patent No.: US 7,361,586 B2
(45) Date of Patent: Apr. 22, 2008

(54) PREAMORPHIZATION TO MINIMIZE VOID FORMATION

(75) Inventors: Ercan Adem, Sunnyvale, CA (US); Nicholas H. Tripsas, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/173,244

(22) Filed: Jul. 1, 2005

(65) Prior Publication Data

US 2007/0020919 A1    Jan. 25, 2007

(51) Int. Cl.
*H01L 21/4763* (2006.01)

(52) U.S. Cl. ............ 438/629; 438/642; 438/658; 257/E29.159; 257/E21.582

(58) Field of Classification Search ........... 438/629, 438/642, 658, FOR. 355, FOR. 405; 257/E29.159, 257/E21.582
See application file for complete search history.

(56) References Cited

U.S. PATENT DOCUMENTS

| | | | |
|---|---|---|---|
| 5,506,449 A * | 4/1996 | Nakano et al. | 257/758 |
| 6,268,291 B1 | 7/2001 | Andricacos et al. | |
| 6,274,511 B1 * | 8/2001 | Wieczorek et al. | 438/766 |
| 6,335,289 B1 * | 1/2002 | Kikuchi | 438/702 |
| 6,375,761 B1 * | 4/2002 | Gambino et al. | 148/301 |
| 6,387,784 B1 * | 5/2002 | Chong et al. | 438/585 |
| 6,633,085 B1 * | 10/2003 | Besser et al. | 257/774 |
| 6,656,763 B1 | 12/2003 | Oglesby et al. | |
| 6,686,263 B1 | 2/2004 | Lopatin et al. | |
| 6,746,971 B1 * | 6/2004 | Ngo et al. | 438/780 |
| 6,753,247 B1 | 6/2004 | Okoroanyanwu et al. | |
| 6,768,157 B2 | 7/2004 | Krieger et al. | |
| 6,770,905 B1 | 8/2004 | Buynoski et al. | |
| 6,773,954 B1 | 8/2004 | Subramanian et al. | |
| 6,781,868 B2 | 8/2004 | Bulovic et al. | |
| 6,787,458 B1 | 9/2004 | Tripsas et al. | |
| 6,803,267 B1 | 10/2004 | Subramanian et al. | |
| 6,825,060 B1 | 11/2004 | Lyons et al. | |
| 6,836,398 B1 * | 12/2004 | Subramanian et al. | 361/302 |
| 6,852,586 B1 | 2/2005 | Buynoski et al. | |
| 6,858,481 B2 | 2/2005 | Krieger et al. | |
| 6,864,522 B2 | 3/2005 | Krieger et al. | |

(Continued)

FOREIGN PATENT DOCUMENTS

EP    1134802    9/2001

OTHER PUBLICATIONS

International Search Report for PCT/US06/026045 dated Nov. 23, 2006.

*Primary Examiner*—Michelle Estrada
(74) *Attorney, Agent, or Firm*—Amin, Turocy & Calvin, LLP (57) ABSTRACT

Methods are described for eliminating void formation during the fabrication of and/or operation of memory cells/devices. According to one aspect of the present disclosure, the methods to eliminate voids include formation of an opening on a semiconductor structure, formation of a diffusion barrier layer, deposition of a metal into the opening, preamorphization of the metal using preamorphization implants, and formation of a conductivity facilitating layer. According to another aspect of the present disclosure, the methods to eliminate voids include formation of an opening on a semiconductor structure, formation of a diffusion barrier layer, deposition of a metal into the opening, preamorphization of the metal using a contact with a plasma, and formation of a conductivity facilitating layer.

20 Claims, 7 Drawing Sheets

U.S. PATENT DOCUMENTS

| | | |
|---|---|---|
| 6,878,961 B2 | 4/2005 | Lyons et al. |
| 2001/0053592 A1 | 12/2001 | Sone |
| 2002/0055265 A1* | 5/2002 | Ring ............................ 438/714 |
| 2004/0084670 A1* | 5/2004 | Tripsas et al. ................. 257/40 |
| 2004/0108501 A1* | 6/2004 | Cheung et al. ................ 257/40 |
| 2004/0157407 A1* | 8/2004 | Tong et al. .................. 438/455 |
| 2004/0238963 A1* | 12/2004 | Fujisawa ..................... 257/758 |
| 2006/0051968 A1* | 3/2006 | Joshi et al. .................. 438/723 |

* cited by examiner

PREAMORPHIZATION TO MINIMIZE VOID FORMATION

TECHNICAL FIELD

The present invention generally relates to semiconductor fabrication techniques. More particularly, the present invention relates to methods for eliminating void formation in memory cells.

BACKGROUND OF THE INVENTION

In the semiconductor industry, there is a continuing trend toward higher device densities. To achieve these high densities there have been, and continue to be, efforts toward scaling down (e.g., to submicron levels) device dimensions on semiconductor wafers. In order to accomplish such high device packing density, smaller and smaller features sizes are required. These features sizes include the width and spacing of interconnecting lines, and the spacing and diameter of metal contact vias.

Further, the use of and demand for semiconductor devices are increasing. Constant development of these devices requires constant improvements in size, performance and yield. These improvements are accomplished by improving the various processes used in semiconductor fabrication. Processes involving metal are often a challenge for sort yield and process control.

Metallization is one of the processes used in semiconductor fabrication. Metallization generally involves forming metal structures including metal layers, interconnects, conductive lines, charge retention layers, passive layers, contacts and plugs. These metal structures are vital to the function of semiconductor devices. The reliability, speed, and efficiency of semiconductor devices is directly linked to the quality of metal structures formed therein.

For example, some metallization processes involve depositing a metal in a trench or via. The metal filled via or trench may undesirably contain voids. Voids lower the conductivity of the metal structure, and thus deleteriously affect the speed and reliability of a semiconductor device.

Figure 1:
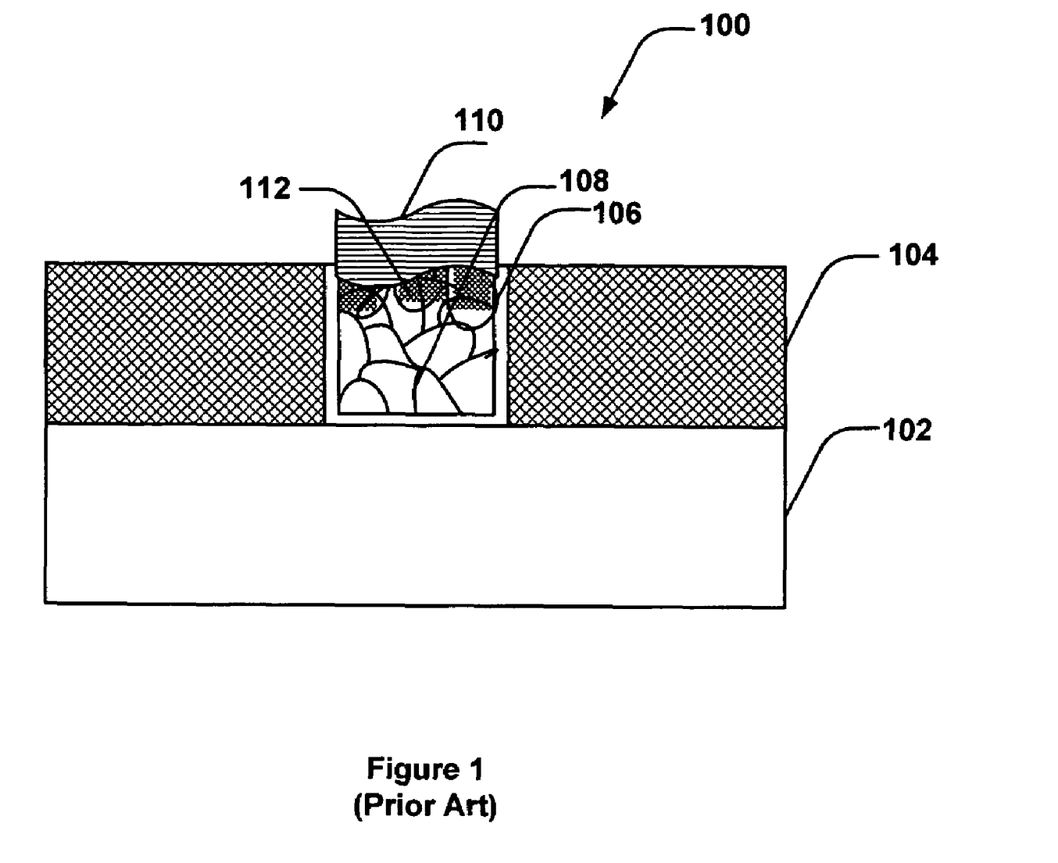
FIG. 1 is a cross sectional illustration of a memory cell showing voids.

Referring to FIG. 1, a cross sectional view of a memory cell 100 illustrating void formation is shown. The memory cell 100 contains a semiconductor substrate 102, a dielectric layer 104 with an opening 106, a metal 108 deposited into the opening 106, and a conductivity facilitating layer 110 overlying the metal layer. Often, voids 112 form in the top region of the metal 108. These voids result in an uneven formation of overlying metal layers 110. The voids also detrimentally affect the performance of memory cells. Thus, there remains an unmet need in the art for improved methods of eliminating voids.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention provides methods for eliminating and/or preventing void formation in metal layers of semiconductor/microelectronic devices. Voids impair the performance of a semiconductor/microelectronic device by altering electrical properties, and could ultimately cause device failure. The present invention utilizes preamorphization implantation to prevent void formation resulting from rapid diffusion of metal atoms/ions along a grain boundary. As a result of the present invention, higher quality metal structures, layers and interconnects can be formed in semiconductor/microelectronic devices. The present invention provides cost-effective solutions to the manufacture of reliable and efficient semiconductor/microelectronic devices.

According to one aspect of the present invention, methods are provided for eliminating and/or preventing voids in a memory cell. The methods involve forming an opening in a dielectric layer of a semiconductor substrate, deposition of a metal into the opening, preamorphization of a portion of the metal using preamorphization implantation, and forming a conductivity facilitating layer over the preamorphized metal.

According to another aspect of the present invention, methods are provided for eliminating and/or preventing void formation in memory cells. The methods involve forming an opening in a dielectric layer of a semiconductor substrate, deposition of a metal into the opening, contacting a portion of the metal with a plasma containing ion species to preamorphize a portion of the metal, and forming a conductivity facilitating layer over the preamorphized metal.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF THE INVENTION

The present invention provides methods that advantageously eliminate voids during fabrication and operation of a memory cell. The methods involve forming an opening in a dielectric layer of a semiconductor substrate, depositing a metal into the opening, amorphizing a portion of the metal using preamorphization implants and/or contact with a plasma containing ion species, and forming a conductivity facilitating layer over the amorphized metal.

Increasingly, metals such as copper (Cu) are being used as interconnect materials in semiconductor manufacture. In the fabrication of a memory cell, often, a metal layer is overlaid with a conductivity facilitating layer. However, during the fabrication and/or operation of the overlying layer, the metal atoms from the metal layer tend to migrate or diffuse into adjacent layers along grain boundary, resulting in void formation. Voids influence electrical conduction, and may also cause distortion in surface characteristics of overlying layers. Thus, voids have the potential to compromise the integrity of memory cells/devices.

Although not wishing to be bound by any theory, it is believed that preamorphization of a metal destroys grains in the amorphized region. Removal of metal grains eliminates void formation and facilitates more uniform movement of metal atoms across the top of the metal layer during subsequent conductivity facilitating layer formation and/or operation of memory cells. Preamorphization can be achieved by utilizing an ion implantation with ion species, such as carbon, sulfur, germanium, argon, silicon, or xenon. Alternatively, preamorphization can also be achieved by bombardment of a metal surface with a plasma containing ion species.

According to one aspect of the present invention, a portion of a metal in an opening of a semiconductor substrate is preamorphized using preamorphization implantation (PAI). PAI can be achieved using any suitable ion implantation apparatus. Commercial implantation apparatus are well known in the art. For example, implanters are available from vendors such as Applied Materials, Inc., Advanced Ion Beam Technology, Inc., Ibis Technology Corp., and Axcelis Technologies.

Any suitable implant species can be used as a preamorphization implant species. For example, elements from groups III, IV, and V in the periodic table may be used. In one embodiment, electrically inactive ions are used. In another embodiment of the present invention, ions of one or more of sulfur, selenium, tellurium, carbon, helium, argon, germanium, xenon, and/or polonium or a compound containing a combination thereof, can be used as an implant species.

The PAI is carried out at an appropriate implant energy level to prevent and/or eliminate void formation. The preamorphization is carried out in such a way as to control the distance to which implanted ions may penetrate the metal. In one embodiment of the present invention, implant species are implanted at an implant energy level from about 0.1 keV to about 500 keV. In another embodiment, implant species are implanted at an implant energy level from about 1 keV to about 100 keV. In yet another embodiment, implant species are implanted at an implant energy level from about 2 keV to about 10 keV.

The concentration of implants can be adjusted to achieve an optimal degree of amorphization of the metal, and can be dependent on the implant species and energy of the implantation. In one embodiment of the present invention, implant species are implanted at a concentration from about $1\times10^{12}$ to about $1\times10^{17}$ atoms/cm$^2$. In another embodiment, implant species are implanted at a concentration from about $1\times10^{13}$ to about $1\times10^{16}$ atoms/cm$^2$. In yet another embodiment of the present invention, implant species are implanted at a concentration from about $1\times10^{14}$ to about $1\times10^{15}$ atoms/cm$^2$.

The PAI is performed at an appropriate angle to confine the localized preamorphous regions to predetermined portions of the metal. In one embodiment of the present invention, the implantation is carried out at an angle zero, measured from perpendicular to the substrate (more specifically zero degrees is perpendicular to the semiconductor substrate upper surface). In another embodiment of the present invention, the implantation process is performed at an implant angle in excess of approximately seven degrees from an angle perpendicular to the upper surface of the semiconductor substrate. When the PAI is performed at an implantation angle substantially greater than zero, the semiconductor substrate can be rotated. The rotation may either be continuously performed, as the implantation is progressing, or in discrete steps.

In one embodiment of the present invention, preamorphization implantation is performed on a substrate with a patterned mask. The presence of a patterned mask layer, coupled with selectively chosen implant energy, dose and angle, results in relatively defined area of preamorphization. In another embodiment of the present invention, masking steps can be omitted prior to preamorphization. In yet another embodiment of the present invention, a blocking layer is formed over the surface of the dielectric layer. The blocking layer will substantially block PAI from reaching areas other than the surface of the metal.

The preamorphization can be carried out at any suitable temperature to prevent and/or eliminate void formation. In one embodiment of the present invention, preamorphization implantation is carried out at room temperature. In another embodiment of the present invention, preamorphization implantation is carried out at a temperature in excess of 10° C.

The depth or thickness to which the metal is preamorphized is suitably regulated to prevent or eliminate void formation. In one embodiment, preamorphization is carried out to a depth of about three times the thickness of conductivity facilitating layer. In another embodiment of the present invention, the metal is made amorphous from about 10 nm to about 100 nm from the top surface of the metal.

In one embodiment of the present invention, the surface of the metal is cleaned after implantation, but prior to the formation of the conductivity facilitating layer. Any suitable solvent can be used to achieve cleaning. For example, hydrofluoric acid (HF) can be used to clean the surface prior to forming a conductivity facilitating layer.

According to another aspect of the present invention, preamorphization of the metal is performed using a plasma containing ion species. The plasma can be generated from gas, liquid or solid. Both electrically inactive and active species can be used as a source of the plasma. For example, a plasma of a gas containing one or more of germanium, argon, helium, xenon, sulfur, carbon and mixtures thereof can be used.

Any suitable apparatus that can generate plasma and energize the ions can be used to bombard the surface of the metal with a plasma containing ion species. For example, an appropriate reactive ion etch tool can be used. Reactive ion etch tools are well known in the art and are commercially available from many suppliers. Typically, reactive ion etch tools contain a plasma generator, a plasma energizer, a radio frequency generator, electrodes, gas chambers, sample holders, controllers, and vacuum generators.

The plasma can be generated by any technique that can generate a plasma capable of achieving preamorphization of the metal. For example, high energy pulses of plasmas can be produced by either magnetic or electrostatic accelerators such as ion beam accelerator, magnetically insulated ion diodes, coaxial plasma guns, magnetically assisted plasma shock generators, and the like. In one embodiment of the present invention, a parallel plate type reactor can be used to generate and contact the surface of the metal with the plasma. In another embodiment of the present invention, an inductively coupled plasma generator can be used to generate the plasma.

The surface of the metal can be exposed to the plasma for a predetermined time interval to preamorphize the metal to a suitable depth. In one embodiment of the present invention, the time of exposure of the surface of the metal to the plasma can be from about 1 second to 1 hour. In another embodiment of the present invention, the time of exposure of the surface of the metal to the plasma can be any time sufficient to preamorphize one-third of the metal from the top surface of the metal.

The plasma is energized using an appropriate radio frequency, generated through RF generators. The RF power of the reactive ion etch tool is adjusted such that preamorphization to a desired thickness is achieved. In one embodiment of the present invention, RF power from about 10 to about 600 W at 13.56 MHz can be used.

The plasma implantation can be done at any suitable implant energy level to prevent and/or eliminate void formation. For example, the implant energy may be from about 0.1 KeV to about 50 KeV. The surface self-bias voltage can be set according to the plasma system used. A bias voltage is generated by an appropriate apparatus so that ions are accelerated vertically to bombard the surface of the metal. In one embodiment of the present invention, a self bias voltage from about 50 to about 500 V can be used. In another example of the present invention, self bias voltage is adjusted such that no undercutting of the semiconductor substrate occurred. The PAI is carried out using a plasma of any suitable density to prevent and/or eliminate void formation. In one embodiment of the present invention, the plasma density is typically from about $1 \times 10^9$ ions per $cm^3$ to about $1 \times 10^{13}$ ions per $cm^3$.

To obtain optimal amorphization of the metal, the temperature of the metal surface is maintained from about 100° C. to about 400° C. Optionally, before forming a conductivity facilitating layer over the preamorphized metal, a washing step may be added to remove any oxides formed on the metal surface. Solvents such as HF may be used for washing.

The present invention may be understood and its advantages appreciated in conjunction with figures and drawings, wherein like numerals represent like features throughout. It be understood that the description of these embodiments are merely illustrative and they should not be taken in a limiting sense.

The term "semiconductor substrate" refers to any semiconducting wafer with or without additional layers and/or elements including dielectrics, interconnects, barrier layers, device structures, active elements and passive elements including gates, trenches, word lines, source regions, drain regions, bit lines, base emitters, collectors, vias, layers, interconnects, plugs, inter layer dielectrics, conductors, passivization layers, and the like.

In the context of the present invention, the terms "memory element" and "controllably conductive media" are used interchangeably. The memory element comprises a passive layer and a polymer layer. The term "polymer layer" is also referred to as "organic layer," "organic polymer layer," "semiconducting polymer layer," and "polymer film." The terms "top electrode" and "bottom electrode" in the present application are only for illustrative purposes and should not be considered as limiting. It is to be appreciated that a person skilled in the art would be able to form electrodes of the present invention in different configurations/positions and still be within the scope of the present invention. Similarly, it is to be noted that a person skilled in the art would be able to refer to electrodes with different terms such as first and second, lower and higher, and the like, and still be within the scope of the present invention.

Figure 2:
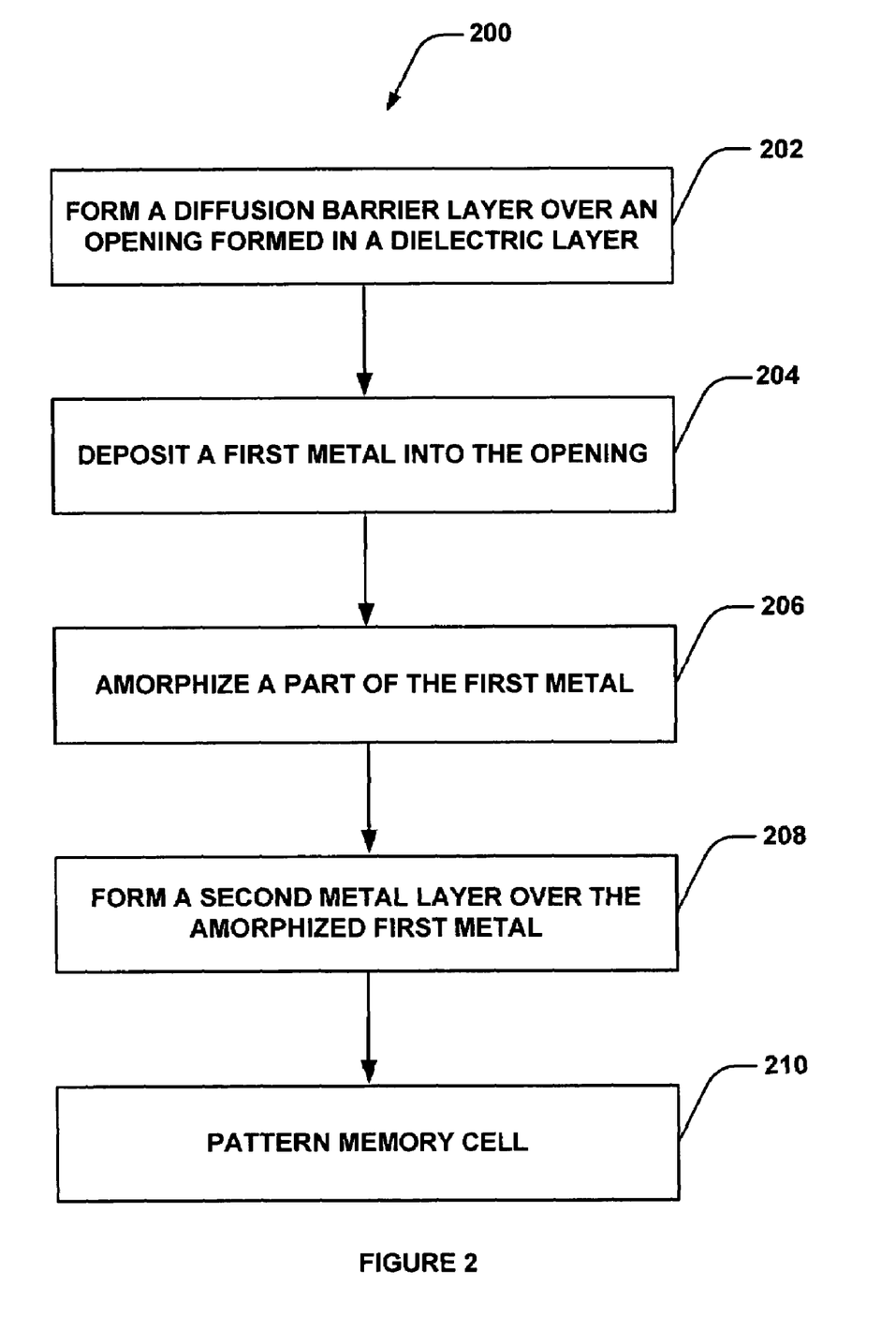
FIG. 2 is a flow chart depicting an exemplary methodology for eliminating void formation according to one aspect of the present invention.

Referring to FIG. 2, a flow chart of an exemplary methodology 200, for eliminating void formation in a memory cell according to one aspect of the present invention, is shown. The method 200 involves forming a diffusion barrier layer over an opening formed in a dielectric layer of a semiconductor substrate (act 202), depositing a metal into the opening (act 204), amorphizing a portion of the metal (act 206), forming a conductivity facilitating layer overlying the amorphized metal (act 208), and patterning the memory cell (act 210).

For simplicity of explanation, the methodologies are depicted and described as a series of acts. Also, the drawings and figures are for illustrative purposes only and as such do not represent drawings and figures drawn to a scale. It is to be understood and appreciated that the present invention is not limited by the acts illustrated and/or by the order of acts, for example acts can occur in various orders and/or concurrently, and with other acts not presented and described herein. Furthermore, not all illustrated acts may be required to implement the methodologies in accordance with the present invention. In addition, those skilled in the art will understand and appreciate that the methodologies could alternatively be represented as a series of interrelated states via a state diagram or events.

Figure 3:
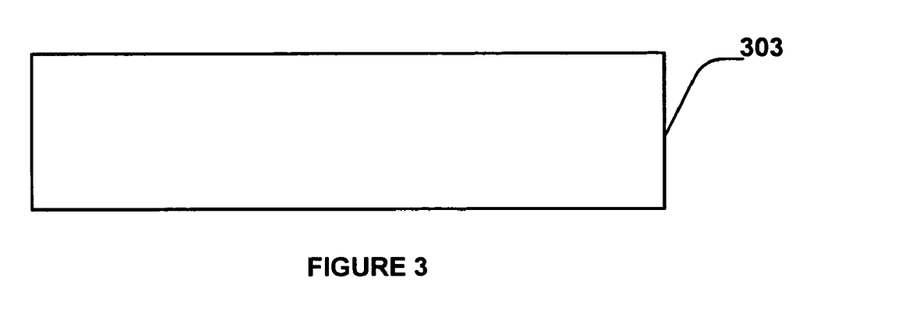
FIGS. 3 to 7 illustrate cross-sectional views of a memory cell undergoing various stages of fabrication according to one aspect of the present invention.

Act 202 of method 200 is forming a diffusion barrier layer over an opening formed in a dielectric layer of a semiconductor substrate. The substrate for act 202 can be any substrate used in the course of semiconductor processing or any semiconductor surface. FIG. 3 shows a cross sectional view of an exemplary substrate 303 prepared for carrying out act 202. The substrate 303 is formed using methods known to one skilled in the art. Examples of substrate 303 for the present invention include semiconductor materials such as gallium arsenide (GaAs), germanium, silicon, silicon germanium, lithium niobate, and compositions containing silicon such as crystalline silicon, polysilicon, amorphous silicon, epitaxial silicon, and silicon dioxide ($SiO_2$) and mixtures thereof. Typically, the substrate 303 is a silicon substrate, optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc.

Figure 4:
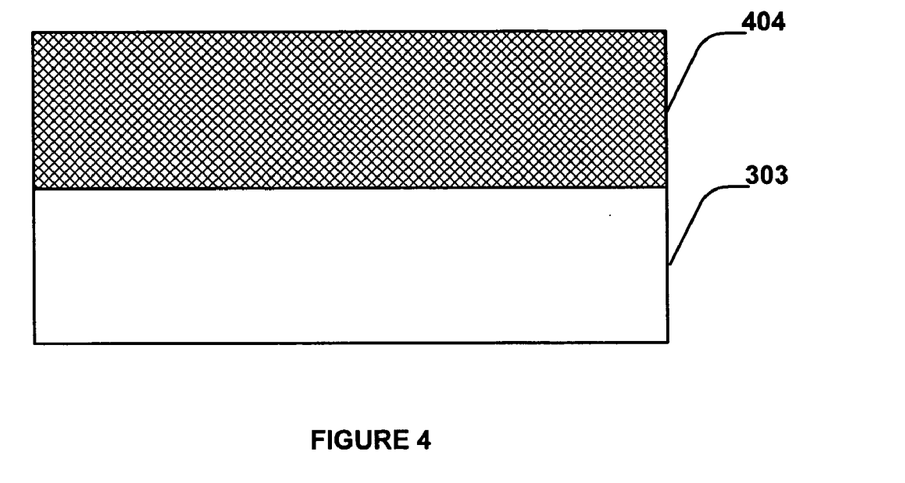

FIG. 4 shows a cross sectional view of a dielectric layer 404 on the substrate 303. Any dielectric material can be used. Both organic and inorganic dielectric materials may be used. Similarly, both low and high k dielectrics may be used. Also both polymeric, amorphous, crystalline and monomeric materials can be used as dielectric materials for this invention. Examples of dielectric materials include silicon containing spin-on glasses such as alkoxysilane polymer, a siloxane polymer, a silsesquioxane polymer, a poly(arylene ether), a fluorinated poly(arylene ether), other polymer dielectrics, nanoporous silica or mixtures thereof. Optionally, prior to formation of dielectric layer 404, one or more layers of insulators, barriers, metal interconnects, and/or passivization layers can be formed on the substrate 303.

The dielectric layer 404 can be formed by any suitable technique. For example, chemical vapor deposition (CVD), plasma enhanced chemical vapor deposition (PECVD), low pressure chemical vapor deposition (LPCVD), or high pressure chemical vapor deposition (HPCVD) methods can be used. Polymeric dielectrics can also be formed by using spin-coating, dip-coating, or spraying.

The dielectrics are deposited to a thickness appropriate to facilitate via formation and subsequent fabrication procedures. Typically, dielectrics are deposited to a thickness of about 1000 Å to about 50,000 Å. In one embodiment of the present invention, the dielectric layer 404 is deposited over substantially the entire surface of the substrate 303. In another embodiment of the present invention, the dielectric layer 404 is deposited on part of the surface of the substrate 303.

Figure 5:
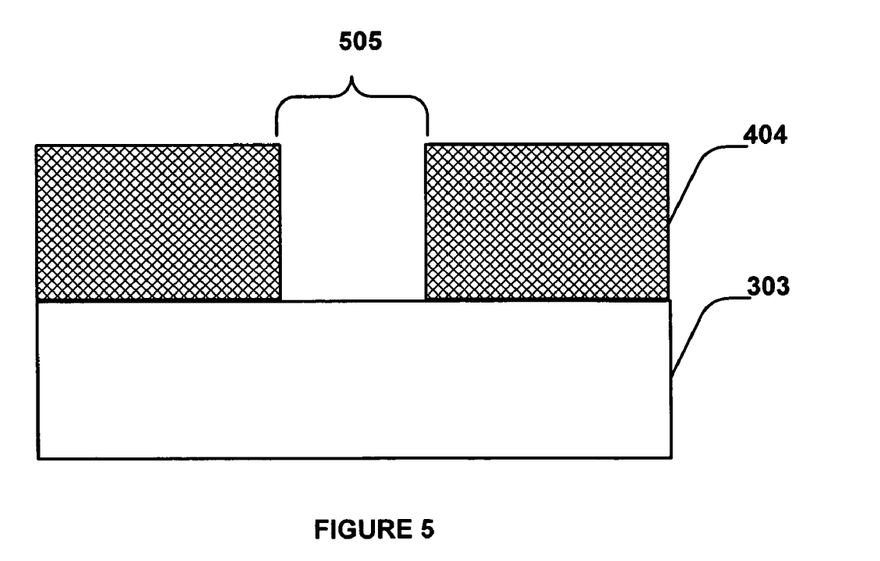

FIG. 5 shows forming an opening 505 in the dielectric layer 404. In one embodiment of the present invention, the opening 505 is a via. Other examples of openings include trenches, grooves and lines. Hereinafter, the present invention is described with reference to a via, and it be noted that implementation of the present methodology with other types of openings is within the scope of the present invention.

Vias are generally formed through a dielectric material disposed on a substrate or between conductive layers. The via 505 can be formed by employing any standard technique. For example, the via 505 can be formed by a lithography process followed by etching. Lithography can use both positive and negative resists, which are available commercially. Lithographic techniques for forming vias in a dielectric are well known in the art. Any etching process can be used for forming the via 505. For example, a plasma etch can be used to form the via 505. Plasma etch can take place in a parallel plate reactor using an ion-assisted reactant. The resist is completely removed from the dielectric surface and the inside walls of the via 505 by plasma etching. The via 505 can have relatively vertical sidewalls which extend perpendicular to the topological surface of the dielectric layer 404.

Figure 6:
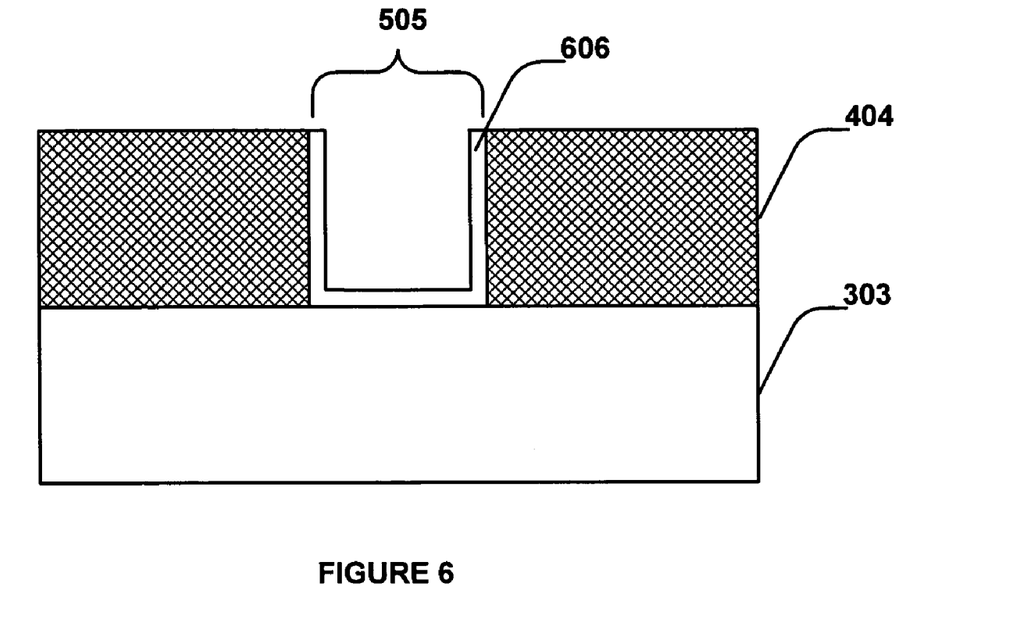

FIG. 6 shows forming of a diffusion barrier layer 606 over the via 505. The diffusion barrier layer 606 may be formed upon the surface of the dielectric layer 404 such that the substrate 303 at the base of the via 505 is covered with the diffusion barrier layer 606. The criterion for selecting a barrier metal is that the barrier metal and the fill metal have significantly different removal selectivity characteristics. Any suitable metal that meets the above criterion can be used as the diffusion barrier. Examples of barrier metals include titanium, titanium nitride, tantalum, tantalum nitride, tungsten, tungsten-titanium or any other materials that effectively block diffusion of metal atoms into the dielectric layers. In one embodiment of the present invention, tantalum (Ta) is used as the diffusion barrier. In another embodiment of the present invention, compounds or alloys containing Ta are used as the diffusion barrier. Examples include tantalum oxide, tantalum chloride, tantalum bromide, tantalum sulfide, tantalum nitride and the like.

The diffusion barrier layer 606 can be formed by any suitable method. For example, the diffusion barrier layer 606 can be formed by deposition techniques such as CVD, PVD, PECVD, LPCVD, sputtering, evaporation, or electroplating.

The thickness of the diffusion barrier layer 606 is controlled. For example, in one embodiment of the present invention, the diffusion barrier layer 606 can have a thickness from about 1 Å to about 200 Å. In another embodiment, the thickness of the diffusion barrier layer 606 is from about 5 Å to about 50 Å. In yet another embodiment of the present invention, the diffusion barrier layer 606 has a thickness of about 10 Å to about 30 Å.

Figure 7:
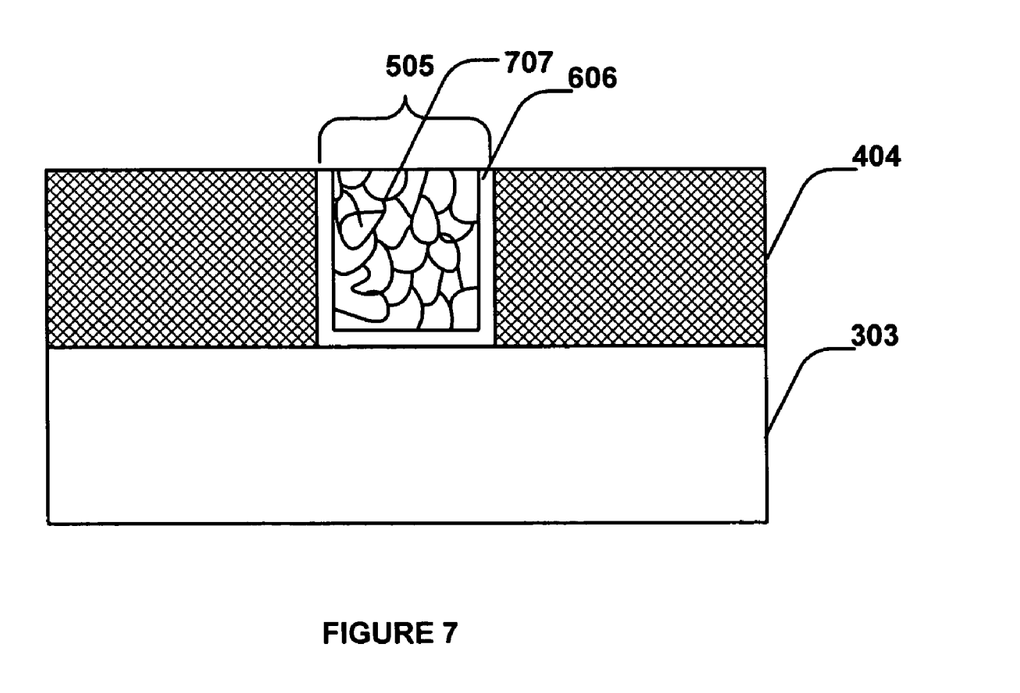

Act 204 of method 200 is depositing a metal into the via 505. FIG. 7 shows a cross sectional illustration of a metal layer 707 in a via undergoing fabrication in accordance with one aspect of the present invention. Any suitable metal can be used to form the metal layer 707. For example copper, tungsten, silver, gold, and the like can be used. In one embodiment of the present invention, copper is used as the metal. In another embodiment of the present invention, compounds of copper, alloys of copper, and/or mixtures thereof are used as the metal. In one embodiment of the present invention, the metal layer 707 forms a bottom electrode. In another embodiment of the present invention, the metal layer 707 acts as a memory plug.

The metal layer 707 is deposited using standard metal depositing techniques. For example, CVD, PVD, PECVD, evaporation, sputtering, atomic layer deposition and the like can be used. In one embodiment of the present invention, a seed layer of the metal is formed over the diffusion barrier layer 606. This seed layer is typically on the order of about 1000-3000 Å in thickness and is either a pure metal or a metal alloy. The seed layer is formed using a technique such as CVD. In one embodiment, the seed layer may also interact with the previously deposited barrier layer 606. After formation of the seed layer, the metal layer 707 is completed by depositing additional metal using electroplating and/or blanket deposition. The additional metal may be either pure metal or an alloy.

The metal layer 707 is deposited such that it covers the via 505. The deposited metal accumulates within the via 505 to an elevation level above the adjacent surface of the dielectric layer 404. In one embodiment of the present invention, the metal is filled to cover the dielectric layer 404. Typically, the metal layer 707 has a thickness from about 1000 to 20,000 Å.

Optionally, planarization may be carried to remove the metal layer 707 in areas exclusive of the via. The planarization can be performed by any suitable technique. For example, chemical mechanical polishing, reactive ion etching, or plasma etching can be used. The metal can be planarized such that both the top surface of the dielectric layer 404 and the metal layer 707 are at the same level.

Figure 8:
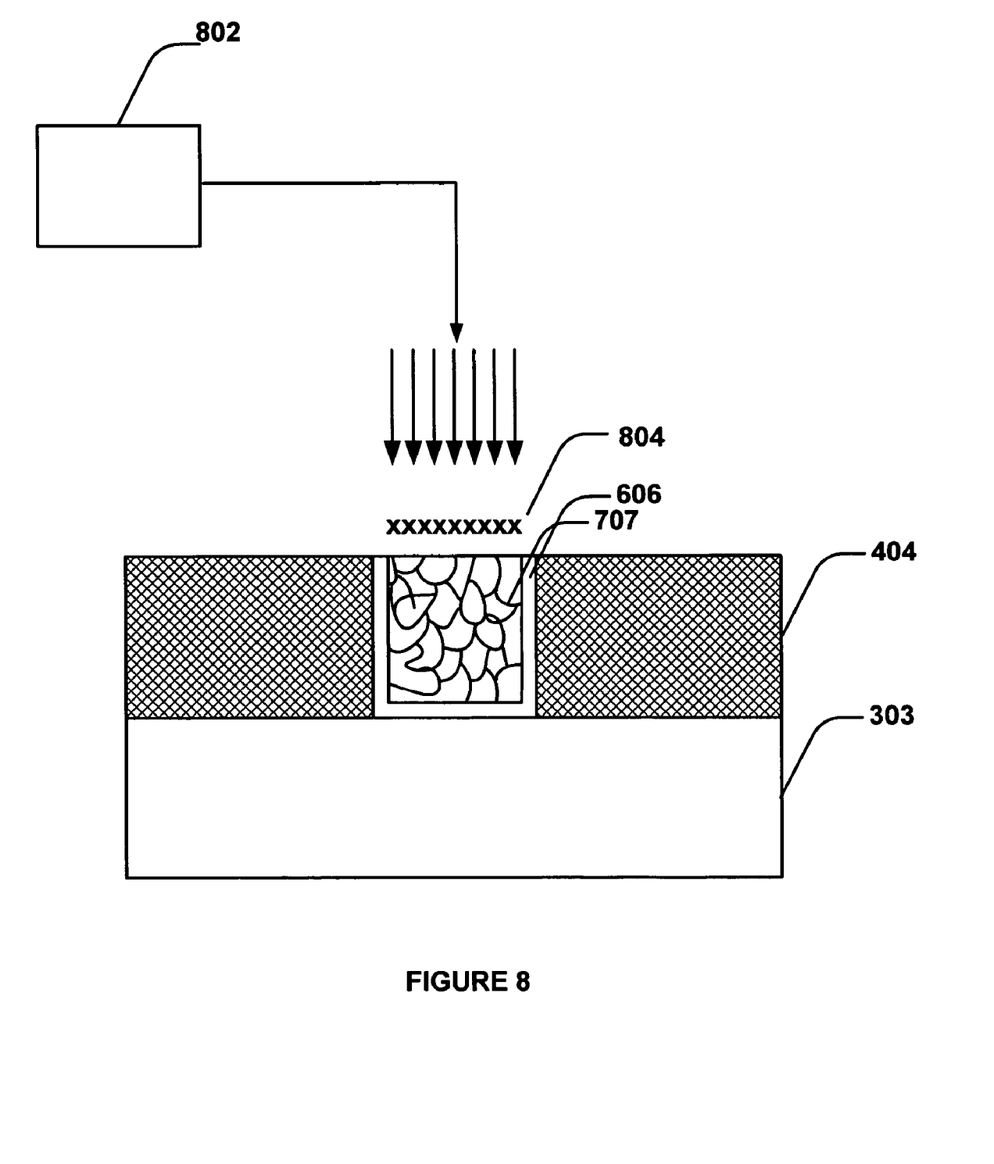
FIG. 8 is a cross sectional illustration of a memory cell undergoing preamorphization according to one aspect of the present invention.

Act 206 is preamorphizing a portion of the metal in the metal layer 707. According to one aspect of the present invention, the a portion of the metal in the metal layer 707 preamorphized using PAI. PAI is affected directly onto the surface of the metal using a preamorphization implant species as described earlier. FIG. 8 is a cross sectional view of a structure from act 204 undergoing PAI, and showing an implantation source 802 and implant species 804. The implant species 804 is directed to contact the surface of the metal layer 707. The implanted atoms or ions (X) combine with the metal atoms in the shallow/upper regions of the metal layer to destroy grain structure and preamorphize a portion of the metal in the metal layer 707. The implant species bombard the surface of the metal layer 707 with sufficient energy to convert a part of the region adjacent to the surface into an amorphous region.

Optionally, act 206 may include heating and/or annealing of the surface of the metal. Annealing specifically includes rapid thermal annealing. In one embodiment, the implanted metal is heated to a temperature from about 200° C. to about 500° C. for about 1 second to about 30 minutes. In another embodiment, the implanted metal is heated to a temperature from about 225° C. to about 450° C. for about 10 seconds to about 10 minutes. In yet another embodiment, the implanted metal is heated to a temperature from about 250° C. to about 400° C. for about 30 seconds to about 3 minutes.

The optional heat treatment/annealing can be performed under an inert or non-reactive environment. For example, the chamber in which heating takes place may contain one or more of hydrogen ($H_2$), nitrogen ($N_2$), helium, neon, argon, krypton, xenon, and the like. For example, the heating chamber may contain a mixture of nitrogen and hydrogen or a mixture of nitrogen and argon.

Figure 9:
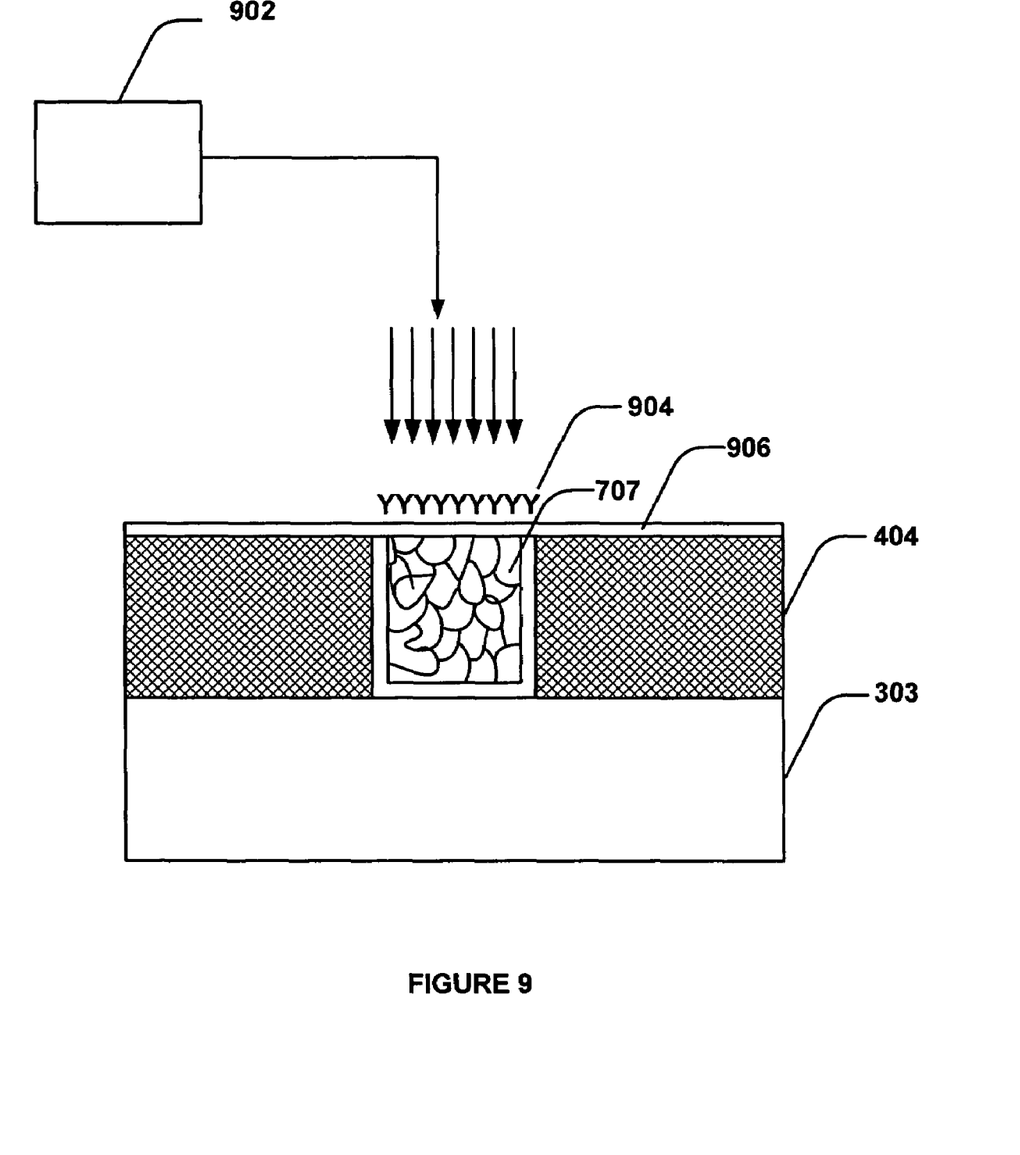
FIG. 9 is a cross sectional illustration of a memory cell undergoing preamorphization according to one aspect of the present invention.

According to another aspect of the present invention, preamorphization of a portion of the metal is achieved by contacting the surface of the metal layer 707 with a plasma containing ion species as described earlier. FIG. 9 is a cross sectional illustration of a memory cell undergoing fabrication according to one aspect of the present invention, showing preamorphization of the metal through a contact with a plasma 904 generated and energized using an apparatus 902. Typically, preamorphization of the metal in the via opening can be achieved by bombarding the surface of the metal layer 707 with ion species Y, found in the plasma 904, making certain that no significant etching occurs.

Figure 10:
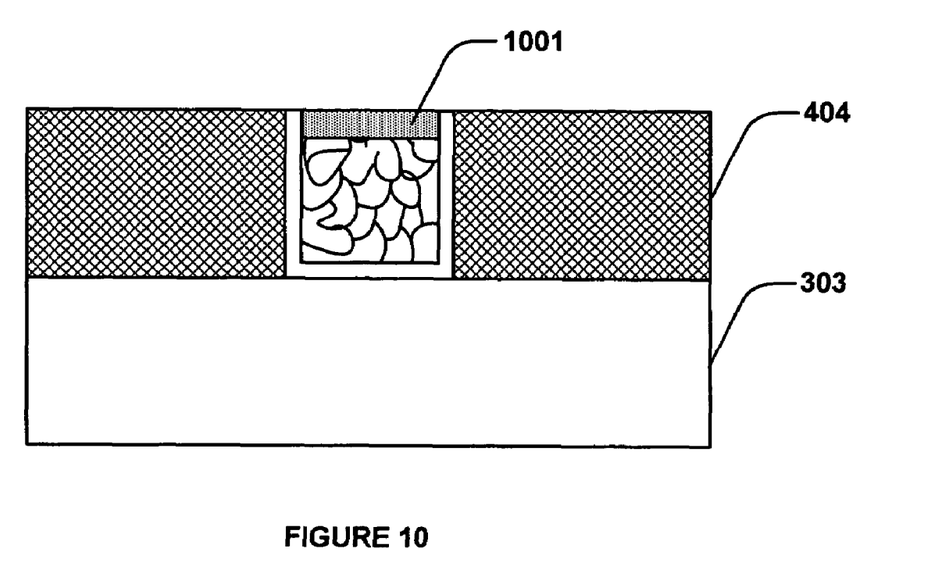
FIG. 10 is a cross sectional illustration of a memory cell undergoing fabrication according to one aspect of the present invention.

FIG. 10 is a cross sectional illustration of a memory cell showing a region of preamorphized metal 1001. Both implantation with implant species, and contact with plasma can be effective in producing a thin, uniform amorphous region.

Figure 11:
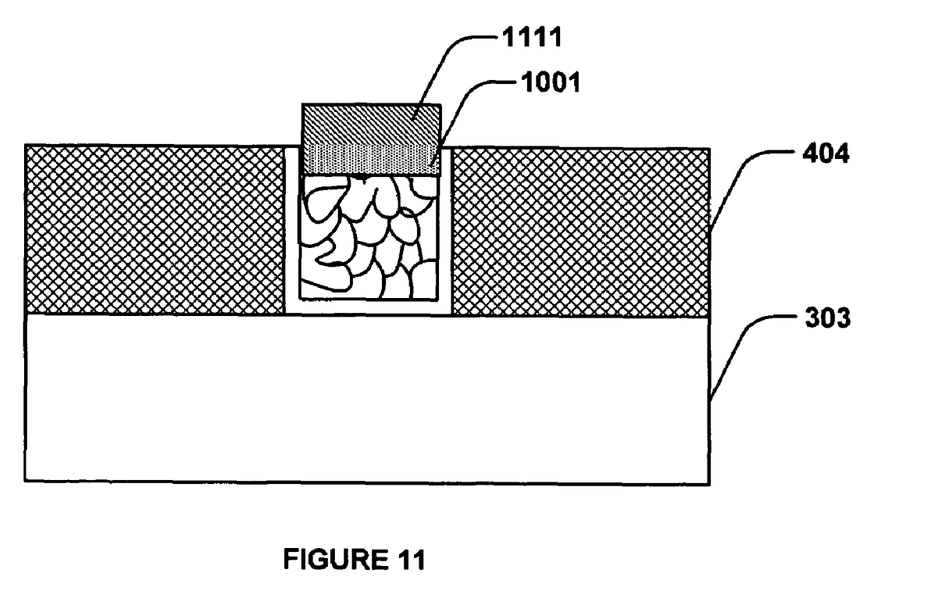
FIG. 11 is a cross sectional illustration of a memory cell undergoing fabrication according to one aspect of the present invention.

Act 208 of method 200 is forming a conductivity facilitating layer overlying the amorphized metal layer. FIG. 11 is a cross sectional illustration of a memory cell undergoing fabrication according to one aspect of the present invention, showing formation of a conductivity facilitating layer 1111 overlying the preamorphized metal surface 1001.

The conductivity facilitating layer 1111 can be made of one or more conductivity facilitating compounds. In one embodiment of the present invention, the conductivity facilitating compound can be copper, alloys of copper, compounds containing copper or combinations thereof. Examples of conductivity facilitating compounds include one or more of copper sulfide ($Cu_2S$, CuS), copper rich copper sulfide ($Cu_3S$, CuS; $Cu_3S$, $Cu_2S$), copper oxide (CuO, $Cu_2O$), copper selenide ($Cu_2Se$, CuSe), copper telluride ($Cu_2Te$, CuTe), manganese oxide ($MnO_2$), titanium dioxide ($TiO_2$), indium oxide ($I_3O_4$), silver sulfide ($Ag_2S$, AgS), gold sulfide ($AU_2S$, AuS), iron oxide ($Fe_3O_4$), cobalt arsenide ($CoAs_2$), nickel arsenide (NiAs), and the like.

The conductivity facilitating layer 1111 is formed using oxidation techniques, formed via gas phase reactions, implantation techniques, or deposited. In some instances, the conductivity facilitating layer 1111 may be treated with a plasma after it is formed. The plasma treatment modifies the energy barrier of the conductivity facilitating layer 1111.

In one embodiment, the conductivity facilitating layer 1111 containing the conductivity facilitating compound has a thickness of about 2 Å or more. In another embodiment, the conductivity facilitating layer 1111 has a thickness of about 10 Å or more. In yet another embodiment, the conductivity facilitating layer 1111 has a thickness of about 50 Å or more.

A conductivity facilitating layer 1111 with a smooth surface results when it is formed over an amorphized metal layer according to the present invention (FIG. 11), whereas a conductivity facilitating layer with a bumpy and irregular surface results when it is formed over a metal layer which is not amorphized (FIG. 1).

The conductivity facilitating layer 1111 of the present invention can be advantageously used in further fabrication procedures. In one embodiment of the present invention, the conductivity facilitating layer 1111 of the present invention can be used as a passive layer to form a memory element of a polymer memory cell.

Typically, a polymer memory cell comprises a memory element sandwiched between two or more electrodes. The memory element of a polymer memory cell comprises a passive layer and an active layer. The metal layer 707 of the present invention can function as an electrode.

The active layer of the present invention can be formed using any suitable low conducting material. Examples of materials that can be used in the formation of the active layer include organic semiconducting materials, inorganic semiconducting materials, and mixtures of organic and inorganic semiconducting materials. The active layer can be formed using techniques well known to a person in the art.

General examples of the organic semiconducting materials include at least one of an organic polymer (such as a conjugated organic polymer), an organometallic compound (such as a conjugated organometallic compound), an organometallic polymer (such as a conjugated organometallic polymer), a buckyball, a carbon nanotube (such as a C6-C60 carbon nanotubes), and the like.

General examples of the low conducting inorganic materials include transition metal sulfides, chalcogenides, and transition metal oxides. Examples of inorganic materials include cupper oxide (CuO, $Cu_2O$), iron oxide (FeO, $Fe_3O_4$), manganese oxide ($MnO_2$, $Mn_2O_3$, etc), titanium oxide ($TiO_2$).

The active layer can also contain a mixture of organic and inorganic materials. The inorganic material (transition metal oxide/sulfide) is usually embedded in an organic semiconductor material. Examples include polyphenylacetylene mixed with $Cu_2S$, polyphenylacetylene mixed with $Cu_2O$, and the like.

In one embodiment of the present invention, the active layer is a semiconducting polymer layer. The semiconducting polymer layer can contain one or more semiconducting polymers. The semiconducting polymer layer can be formed by spin-on techniques (depositing a mixture of the polymer/polymer precursor and a solvent, then removing the solvent from the substrate/electrode), by CVD, optionally including a gas reaction, gas phase deposition, and the like. CVD includes LPCVD, PECVD, and HDCVD. During formation or deposition, the polymer material may self assemble between the electrodes. It is not typically necessary to functionalize one or more ends of the organic polymer in order to attach it to an electrode/passive layer. Examples of semiconducting polymers include conjugated organic polymers, organometallic polymers, carbon structures such as carbon nanotubes and buckyballs, and the like.

A carbon nanotube is typically a hexagonal network of carbon atoms that is rolled up into a seamless cylinder. Each end may be capped with half of a fullerene molecule. Carbon nanotubes may be prepared by the laser vaporization of a carbon target (a cobalt-nickel catalyst may facilitate growth) or a carbon-arc method to grow similar arrays of single-wall nanotubes. A buckyball is more specifically a buckminsterfullerene, a soccer ball-shaped 60-atom or 70-atom cluster of pure carbon.

The organic polymer typically contains a conjugated organic polymer. The polymer backbone of the conjugated organic polymer extends lengthwise between the electrodes. The conjugated organic polymer may be linear or branched, so long as the polymer retains its conjugated nature. Conjugated polymers are characterized in that they have overlapping π orbitals. Conjugated polymers are also characterized in that they may assume two or more resonant structures. The conjugated nature of the conjugated organic polymer contributes to the controllably conductive properties of the controllably conductive media.

In this connection, the semiconducting polymer, such as a conjugated organic polymer, has the ability to donate and accept charges (holes and/or electrons). Generally, the semiconducting polymer or an atom/moiety in the polymer has at least two relatively stable states. The two relatively stable oxidation states permit the semiconducting polymer to donate and accept charges and electrically interact with the conductivity facilitating compound. The ability of the semiconducting polymer layer to donate and accept charges and electrically interact with the passive layer also depends on the identity of the conductivity facilitating compound.

The organic polymers (or the organic monomers constituting the organic polymers) may be cyclic or acyclic. During formation or deposition, the organic polymer self assembles between the electrodes. Examples of conjugated organic polymers include one or more of poly(p-phenylene vinylene); polyporphyrins; porphyrinic macrocycles, thiol-derivatized polyporphyrins; polymetallocenes such as polyferrocenes, polyphthalocyanines, polyvinylenes; polystiroles; polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl) diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl) phenylacetylene; poly(trimethylsilyl) pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes (Fe, V, Cr, Co, Ni and the like); polypyridine metal complexes (Ru, Os and the like); and the like.

Optionally, a thin conductive metal barrier layer may be formed over the memory element. The thin conductive metal barrier may be of any suitable material. In one embodiment of the present invention, the thin conductive metal barrier layer may be of titanium or titanium nitride. The thin conductive metal layer may be formed using any suitable technique. For example, CVD, PVD, evaporation, sputtering, and electro plating can be used.

In one embodiment of the present invention, a top electrode is formed over the semiconducting polymer layer. The top electrode is formed using methods known to one skilled in the art. For example, the top electrode is formed by depositing metals using techniques such as etching, evaporation, PVD, CVD, and PECVD. Optionally, additional layers such as etch stop layers, cap layers, insulating layers, dielectric layers, and the like may be formed before depositing the top electrode.

The top electrode may or may not cover the entire surface of the substrate 303. The top electrode is made of conductive material; such as a conductive metal, conductive metal alloys, conductive metal oxides, conductive polymer films, semiconductive materials, and the like. Specific examples of materials for the top electrode include one or more of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal silicides; and the like. Alloy electrodes specifically include Hastelloy®, Kovar®, Invar, Monel®, Inconel®, brass, stainless steel, magnesium-silver alloy, and various other alloys.

The thickness and width of the top electrode may depend upon the specific lithography and design rules. In one embodiment, the thickness of the top electrode is about 0.01 μm or more and about 10 μm or less. In another embodiment, the thickness of the top electrode is about 0.05 μm or more and about 5 μm or less. In yet another embodiment, the thickness of the top electrode is about 0.1 μm or more and about 1 μm or less.

The position of the top electrode is not critical for the present invention and one skilled in the art would recognize that the first electrode could be placed in a variety of positions without losing the advantages of the present invention.

The top electrode is patterned to form wordlines using standard techniques. It is to be understood that these acts may be repeated to provide a series of suitable layers and conductive paths over one another on the substrate.

The present invention exhibits advantageous features compared to conventional methods of semiconductor fabrication. Preamorphization of a portion of the metal facilitates more uniform movement of metal atoms/ions across the via, due to lack of metal grain boundaries. Further, by removing grains from the boundary regions, the present invention provides semiconductor/microelectronic devices with reliable and durable performance.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such a feature may be combined with one or more other features of the other embodiments as may be desired and advantageous for any given or particular application.

What is claimed is:

1. A method for preventing void formation in a memory cell, comprising:

depositing a metal into an opening of a semiconductor substrate;

preamorphizing a portion of the metal using a preamorphization implantation with an implant species;

forming a conductivity facilitating layer over the amorphized metal;

forming an active layer over the conductivity facilitating layer and a top electrode over the active layer, and a thin barrier layer between the active layer and the top electrode; and patterning the memory cell.

2. The method of claim 1, wherein the metal comprises at least one of copper, alloys of copper, compounds of copper and mixtures thereof.

3. The method of claim 1, wherein the implant species is selected from the group consisting of argon, helium, xenon, germanium, sulfur, selenium, tellurium, polonium, and carbon.

4. The method of claim 1, wherein the preamorphization implantation is performed with an implant energy from about 0.1 keV to about 500 keV.

5. The method of claim 1, wherein the implant species are implanted at a dose ranging from about $1\times10^{12}$ atoms per $cm^2$ to about $1\times10^{17}$ atoms per $cm^2$.

6. The method of claim 1, wherein the metal is implanted to a thickness ranging from about 10 nm to about 100 nm.

7. The method of claim 1, wherein the preamorphization implantation is carried out at an implantation angle greater than zero degrees.

8. The method of claim 1, wherein the conductivity facilitating layer comprises copper sulfide.

9. The method of claim 1, wherein the active layer comprises an organic semiconductor or an inorganic semiconductor material.

10. The method of claim 1, wherein the thin barrier layer comprises titanium or titanium nitride.

11. A method for preventing void formation in a memory cell, comprising:

depositing a metal into an opening of a semiconductor substrate;

preamorphizing a portion of the metal by contacting the metal with a plasma using a reactive ion etch tool, the plasma comprises at least one selected from the group consisting of germanium, sulfur, selenium, tellurium, polonium, and carbon;

forming a conductivity facilitating layer over the amorphized metal;

forming an active layer over the conductivity facilitating layer and a top electrode over the active layer; and patterning the memory cell.

12. The method of claim 11, wherein the plasma comprises sulfur.

13. The method of claim 11, wherein the metal comprises at least one of copper, alloys of copper, compounds of copper and mixtures thereof.

14. The method of claim 11, wherein the plasma has a density from about $1\times10^9$ ions per $cm^3$ to about $1\times10^{13}$ ions per $cm^3$.

15. The method of claim 11, wherein the plasma is energized to a RF power from about 10 to about 600 W.

16. The method of claim 11, wherein the plasma is adjusted to a bias voltage from about 50 V to about 500 V.

17. The method as in claim 11, wherein the plasma is implanted at an implant energy from about 0.1 KeV to about 50 KeV.

18. The method of claim 11, wherein the conductivity facilitating layer comprises one or more of copper sulfide, copper rich copper sulfide, copper oxide, copper selenide, copper telluride, manganese oxide, titanium oxide, indium oxide, silver sulfide, gold sulfide iron oxide, cobalt arsenide, and nickel arsenide.

19. The method of claim 11, further comprising a thin barrier layer between the active layer and the top electrode.

20. A method for preventing void formation in a memory cell, comprising:

depositing a metal into an opening of a semiconductor substrate;

preamorphizing a portion of the metal by contacting the metal with a plasma using a reactive ion etch tool, the plasma comprising at least one selected from the group consisting of germanium, sulfur, selenium, tellurium, polonium, and carbon;

forming a conductivity facilitating layer over the amorphized metal; and patterning the memory cell.

* * * * *